United States Patent
Kim et al.

(10) Patent No.: US 8,673,403 B2
(45) Date of Patent: Mar. 18, 2014

(54) METHOD FOR FORMING FINE PATTERN OF POLYMER THIN FILM

(75) Inventors: Seong Hyun Kim, Daejeon (KR); Sang Chul Lim, Daejeon (KR); Yong Suk Yang, Daejeon (KR); Zin Sig Kim, Daejeon (KR); Doo Hyeb Youn, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 578 days.

(21) Appl. No.: 12/542,188

(22) Filed: Aug. 17, 2009

(65) Prior Publication Data

US 2010/0159139 A1 Jun. 24, 2010

(30) Foreign Application Priority Data

Dec. 19, 2008 (KR) .................. 10-2008-0130132

(51) Int. Cl.
*B05D 1/04* (2006.01)
*B05D 1/36* (2006.01)
*B05D 1/40* (2006.01)

(52) U.S. Cl.
USPC .......................... 427/469; 427/466

(58) Field of Classification Search
USPC ................... 427/466, 469, 261, 265
See application file for complete search history.

(56) References Cited

U.S. PATENT DOCUMENTS

| | | | |
|---|---|---|---|
| 2002/0151161 A1* | 10/2002 | Furusawa | 438/597 |
| 2005/0151820 A1 | 7/2005 | Sirringhaus et al. | |
| 2006/0159838 A1* | 7/2006 | Kowalski et al. | 427/58 |
| 2007/0178280 A1* | 8/2007 | Bower et al. | 428/141 |
| 2009/0130301 A1* | 5/2009 | Bahnmuller et al. | 427/122 |

FOREIGN PATENT DOCUMENTS

| | | |
|---|---|---|
| EP | 1 944 775 A1 | 7/2008 |
| JP | 2002-164635 A | 6/2002 |
| JP | 2004-273851 A | 9/2004 |
| JP | 2006-303199 A | 11/2006 |
| KR | 10-2005-0032255 A | 4/2005 |
| KR | 10-2006-0060232 A | 6/2006 |
| KR | 10-2007-0069609 A | 7/2007 |
| KR | 10-2007-0120390 A | 12/2007 |

OTHER PUBLICATIONS

Sang Chul Lim et al., "High-gain and low-hysteresis properties of organic inverters with an UV-photo patternable gate dielectrics", Thin Solid Films 516 (2008) 4330-4333.

* cited by examiner

*Primary Examiner* — Frederick Parker
(74) *Attorney, Agent, or Firm* — Rabin & Berdo, P.C.

(57) ABSTRACT

Provided is a method of forming a fine pattern of a polymer thin film using a phenomenon that another material having a large difference in surface energy in comparison with a polymer thin film pattern is dewetted on the polymer thin film pattern. Two polymer materials having a large difference in surface energy can be applied to readily and conveniently form a fine pattern of a polymer thin film of micrometer or sub-micrometer grade.

12 Claims, 5 Drawing Sheets

METHOD FOR FORMING FINE PATTERN OF POLYMER THIN FILM

CROSS-REFERENCE TO RELATED APPLICATION

This application claims the benefit of Korean Patent Application No. 10-2008-0130132, filed Dec. 19, 2008, the disclosure of which is hereby incorporated herein by reference in its entirety.

BACKGROUND

1. Field of the Invention

The present invention relates to a method for forming a fine pattern of a polymer thin film, and more particularly, to a method of simply and conveniently forming a fine pattern of a polymer thin film.

2. Discussion of Related Art

An organic thin film transistor (OTFT) uses a semiconductor layer formed of an organic thin film, instead of a silicon layer, which may be classified as a low molecular OTFT such as oligothiophene, pentacene, etc., or a polymer OTFT such as polythiophene, etc., depending on the material of the organic thin film.

In order to fabricate the OTFT, a process of patterning an organic thin film is essentially needed. For this purpose, in the conventional art, a photolithography process is performed to pattern the organic thin film.

However, problems with this include that the photolithography is complicated, the polymer organic thin film may be damaged by an organic solvent included in a photoresist, and a substrate having low thermal stability must be processed at a low temperature.

For this reason, a method of printing a pattern of a polymer organic thin film through an inkjet method, a spin coating method, etc., has been proposed. When the polymer organic thin film pattern is formed by the printing method, adhesive force to a substrate is an important factor. In order to improve the adhesive force to the substrate, conventional plasma surface treatment has been performed.

However, since it is difficult for the conventional plasma surface treatment method to finely control a portion of a substrate surface to be plasma surface treated, it is very difficult to form a fine pattern of less than several micrometers and to form a polymer organic thin film at a desired position in a desired direction.

SUMMARY OF THE INVENTION

The present invention is directed to a method of simply and conveniently forming a fine pattern of a polymer thin film.

According to one aspect of the present invention, a method of forming a fine pattern of a polymer thin film includes: applying a first polymer material on a substrate to form a first polymer thin film pattern; applying a second polymer material having a predetermined difference in surface energy in comparison with the first polymer material on the substrate on which the first polymer thin film pattern is formed; dewetting the second polymer material on the first polymer thin film pattern to move the first polymer thin film pattern toward a substrate region at which the first polymer thin film pattern is not formed; annealing the substrate in a state in which the second polymer material is formed on only the substrate region at which the first polymer thin film pattern is not formed, after a predetermined time elapses; and evaporating an organic solvent included in the second polymer material through annealing to form a second polymer thin film pattern on the substrate.

The applying of the first polymer material may further include making a solution of the first polymer material in droplets; and ejecting the droplets onto the substrate using a near-field electrospinning method to form the first polymer thin film pattern in a linear shape. At this time, in ejecting the droplets onto the substrate, the first polymer thin film pattern may be formed at a predetermined position on the substrate in a predetermined shape.

The first polymer material may include one selected from a polyolefin-based polymer (polyethylene, polypropylene, low-density polyethylene (LDPE)), an aromatic polymer (polystyrene, poly(divinyl benzene)), a chloride-based polymer (polyvinyl chloride, polyvinylidene chloride, polyvinylbenzene chloride), a fluorine-based polymer (polyvinylidenefluoride, polytetrafluoride, polytrivinylfluoride), a silicon-based polymer (polysiloxane), and polybutadiene, which have hydrophobicity, and the second polymer material may include one selected from an insulating material of polyvinyl alcohol and polyvinylphenol, and a conductive material of poly(3,4-ethylenedioxythiophene) (PEDOT), which have hydrophilicity.

In applying the second polymer material, the second polymer material may be applied on the substrate on which the first polymer thin film pattern is applied, using any one printing method selected from inkjet, screen printing, gravure printing, offset printing, and pad printing.

BRIEF DESCRIPTION OF THE DRAWINGS

The above and other features of the present invention will be described in reference to certain exemplary embodiments thereof with reference to the attached drawings in which.

DETAILED DESCRIPTION OF EXEMPLARY EMBODIMENTS

The present invention will be described more fully hereinafter with reference to the accompanying drawings, in which preferred embodiments of the invention are shown.

Prior to description of the present invention, a fine pattern of a polymer thin film is formed by an electrospinning method, without a separate patterning process, and the electrospinning method will be described in brief for the sake of understanding.

Figure 1:
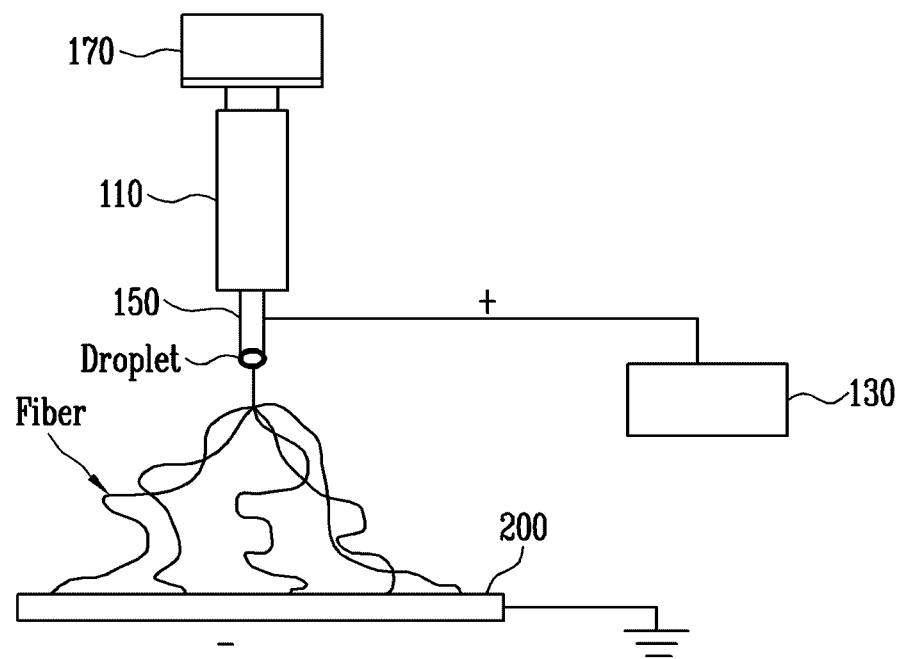
FIG. 1 is a view showing a conventional electrospinning method.
Figure 2:
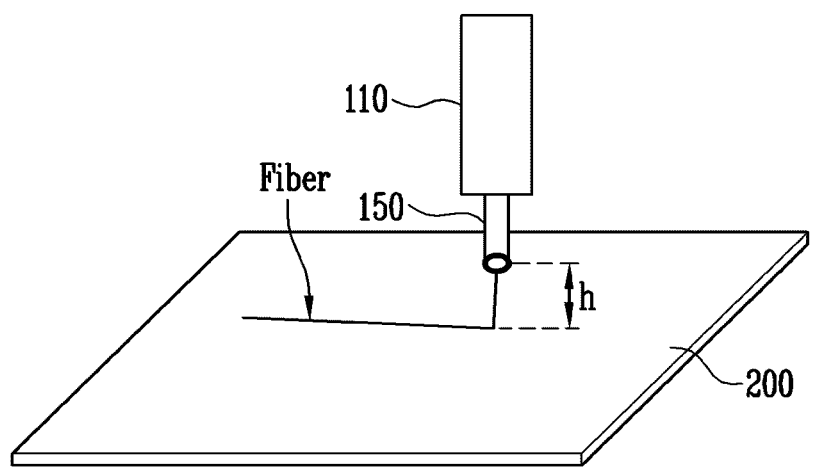
FIG. 2 is a view showing a near-field electrospinning method in accordance with an exemplary embodiment of the present invention.
Figure 3:
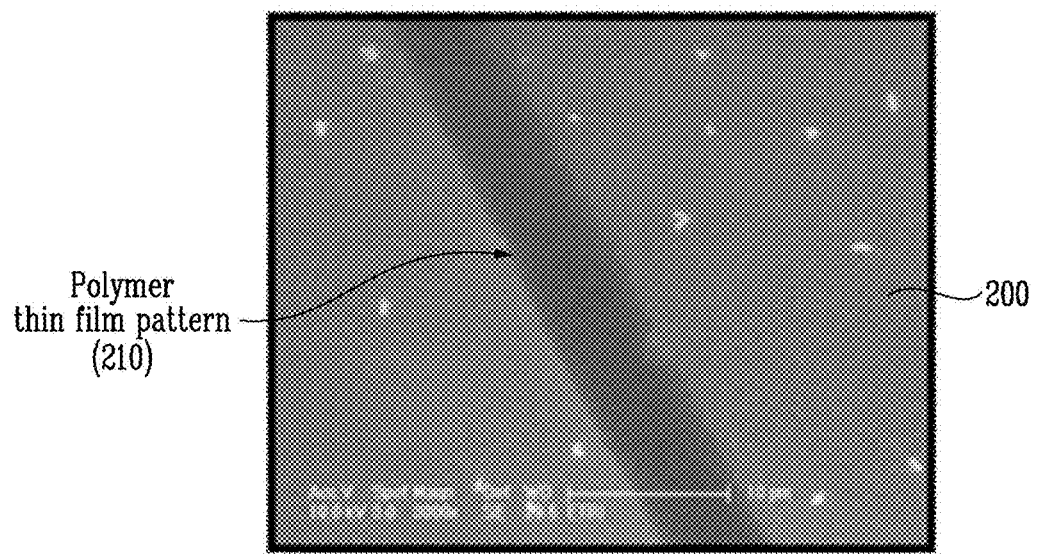
FIG. 3 is a view of a polymer thin film pattern formed by the near-field electrospinning method in accordance with an exemplary embodiment of the present invention.

FIG. 1 is a view showing a conventional electrospinning method, FIG. 2 is a view showing a near-field electrospinning method in accordance with an exemplary embodiment of the present invention, and FIG. 3 is a view of a polymer thin film pattern formed by the near-field electrospinning method in accordance with an exemplary embodiment of the present invention.

Referring to FIG. 1, the electrospinning method is a method of forming a solution of a polymer material to be formed into droplets, forcing the droplets into a syringe 110, and then, applying a DC voltage (generally, 5 to 30 kV) to an injection nozzle 150 through a high-voltage power supply 130 so that the droplets received in the syringe 110 are ejected from the injection nozzle 150 by a syringe pump 170 to deposit the droplets on a substrate 200. At this time, the width of the ejected droplet can be adjusted to adjust the thickness of a first polymer thin film formed on the substrate 200.

However, according to the conventional electrospinning method as shown in FIG. 1, droplets ejected from the injection nozzle 150 become tangled, making it difficult to form a polymer thin film pattern at a desired position in a desired shape.

Therefore, as shown in FIG. 2, a distance h between the injection nozzle 150 and the substrate 200 is reduced to several mm to generate a strong electric field between the substrate 200 and the droplets using a near-field electrospinning method.

That is, droplets ejected from the injection nozzle 150 are first ejected straightly to several mm, and then, irregularly ejected in various paths due to air resistance, etc. For this reason, when the distance h between the injection nozzle 150 and the substrate 200 becomes shorter, the droplets are not affected by the air resistance, etc., so that a polymer thin film pattern 210 can be linearly formed on the substrate 200, as shown in FIG. 3.

Meanwhile, the present invention is characterized in that the fine pattern of the polymer thin film is formed on the substrate 200 using a phenomenon that the polymer thin film pattern 210 is formed by the near-field electrospinning method and another material having a large difference in surface energy is dewetted on the polymer thin film pattern 210, which will be described in detail below.

FIGS. 4A to 4E are views for explaining a method of forming a fine pattern of a polymer thin film in accordance with an exemplary embodiment of the present invention.

Figure 4A:
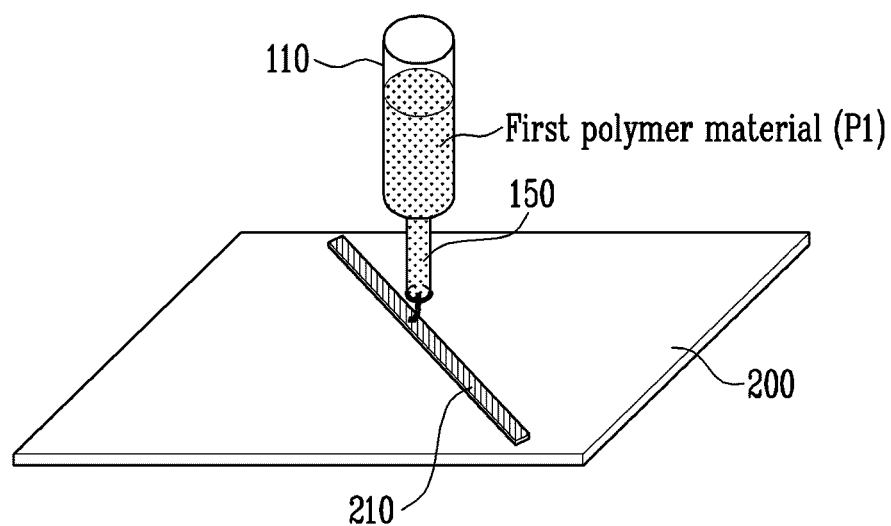
FIGS. 4A to 4E are views for explaining a method of forming a fine pattern of a polymer thin film in accordance with an exemplary embodiment of the present invention.

First, as shown in FIG. 4A, a first polymer material P1 is applied on a substrate 200 at a desired position to form a first polymer thin film pattern 210 through a near-field electrospinning method.

Here, the substrate 200 may be formed of any one of silicon, glass, plastic, paper, and metal.

The first polymer material P1 may include a polyolefin-based polymer (polyethylene, polypropylene, low-density polyethylene (LDPE)), an aromatic polymer (polystyrene, poly(divinyl benzene)), a chloride-based polymer (polyvinyl chloride, polyvinylidene chloride, polyvinylbenzene chloride), a fluorine-based polymer (polyvinylidenefluoride, polytetrafluoride, polytrivinylfluoride), a silicon-based polymer (polysiloxane), or polybutadiene, which has hydrophobicity.

During the process of forming the first polymer thin film pattern 210, when the substrate 200 or the injection nozzle 150 is moved, the first polymer thin film pattern 210 can be formed on the substrate 200 at a desired position in a desired shape, and the width of the first polymer thin film pattern 210 can be adjusted within a range of tens of nanometers to hundreds of micrometers.

Figure 4B:
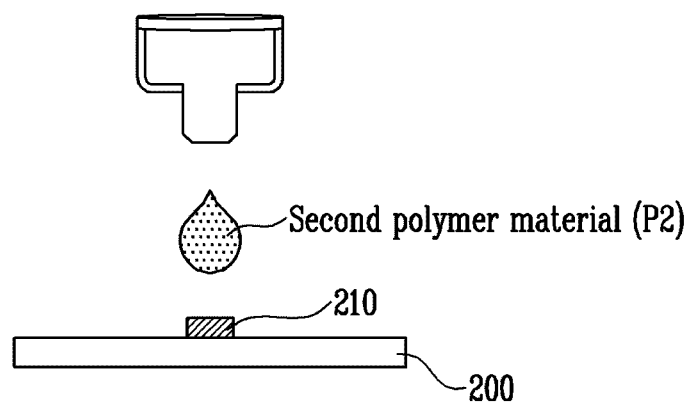

Next, as shown in FIG. 4B, a second polymer material P2 is applied on the substrate 200 on which the first polymer thin film pattern 210 is formed, through inkjet, screen printing, gravure printing, offset printing, pad printing, etc.

At this time, the second polymer material P2 may be a material having a surface energy largely different from the first polymer material P1.

For example, provided that the first polymer material P1 has hydrophobicity, the second polymer material P2 may be any one selected from an insulating material of polyvinyl alcohol and polyvinylphenol, and a conductive material of poly(3,4-ethylenedioxythiophene) (PEDOT), which have a difference in surface energy of about 10 $mJ/m^2$ in comparison with the first polymer material P1 and strong hydrophilicity.

Figure 4C:
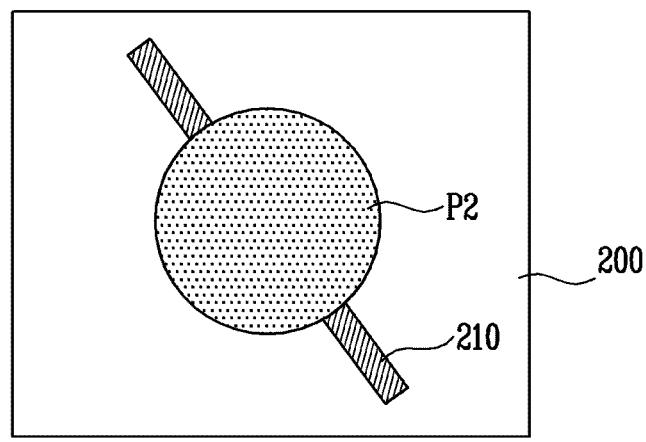
Figure 4D:
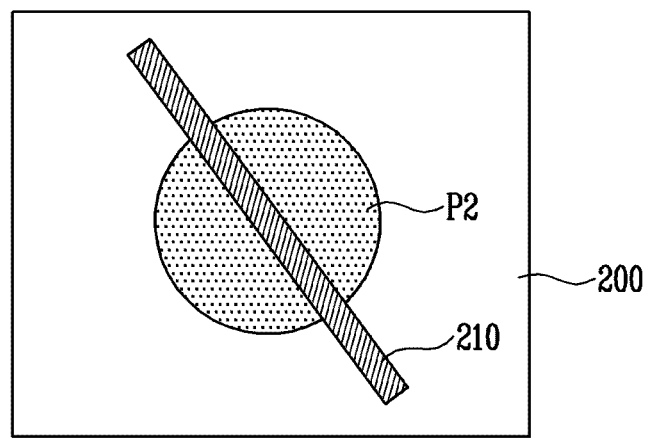

When the second polymer material P2 is applied on the substrate 200 on which the first polymer thin film pattern 210 is formed, while the second polymer material P2 is first applied to form a film on the entire first polymer thin film pattern 210 as shown in FIG. 4C, the second polymer material P2 slowly moves toward a region of the substrate 200 on which the first polymer thin film pattern 210 is not formed, as time elapses. In addition, after a predetermined time elapses, as shown in FIG. 4D, the second polymer material P2 is not formed on the first polymer thin film pattern 210 having a relatively large surface energy difference, and the second polymer material P2 is formed only on the substrate 200 having a relatively small surface energy difference.

Figure 4E:
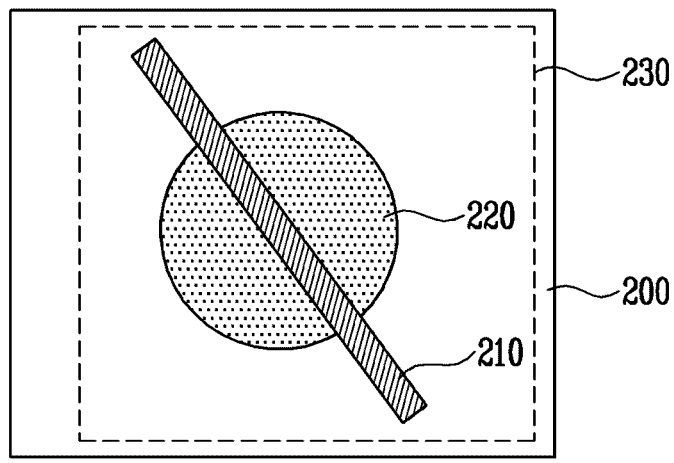

Next, when the substrate 200 is annealed, an organic solvent included in the second polymer material P2 is evaporated to form the first polymer thin film pattern 210 and a second polymer thin film pattern 220 on the substrate 200 as shown in FIG. 4E.

That is, after the first polymer material P1 is applied on the substrate 200 to form the first polymer thin film pattern 210 through the near-field electrospinning method, when the second polymer material P2 having a large difference in surface energy in comparison with the first polymer material P1 is applied thereon, due to the difference in surface energy, the second polymer thin film pattern 220 is formed only on a region other than that of the first polymer thin film pattern 210, and thus, a self-aligned polymer thin film fin pattern 230 can be obtained.

As described above, two polymer materials P1 and P2 having a large difference in surface energy can be applied to readily and conveniently form a fine pattern 230 of a polymer thin film of a micrometer or sub-micrometer grade.

Therefore, when the fine pattern 230 of the polymer thin film fabricated according to the present invention is used as an active layer of an organic thin film transistor, it is possible to fabricate a high-sensitivity sensor having excellent detection sensitivity and a high speed transistor having a very high charge transfer rate.

As can be seen from the foregoing, two polymer materials having a large difference in surface energy can be applied to readily and conveniently form a fine pattern of a polymer thin film of micrometer or sub-micrometer grade.

Therefore, when the fine pattern of the polymer thin film fabricated according to the present invention is used as an active layer of an organic thin film transistor, it is possible to fabricate a high speed transistor having a very high charge transfer rate.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A method of forming a pattern of a polymer film comprising:
applying a first polymer material, which has hydrophobicity, on a substrate to form a first polymer film pattern, the first polymer film pattern having a linear shape with a width within a range of tens of nanometers to hundreds of micrometers;

applying a second polymer material, which has a conductive material, on the substrate on which the first polymer film pattern is formed, to cover at least a portion of the first polymer film pattern, wherein the second polymer material has a predetermined difference in surface energy from the first polymer material;

dewetting the second polymer material covering the first polymer film pattern to move toward a substrate region at which the first polymer film pattern is not formed;

annealing the substrate in a state in which the second polymer material has moved to the extent that the second polymer material does not cover the first polymer film pattern; and evaporating an organic solvent included in the second polymer material through annealing to form a second polymer film pattern on the substrate, wherein:

the first polymer film pattern, taken from a plan view, does not have any opening; and the first and second polymer film patterns are disposed on the substrate, such that a top surface of the substrate defines a first region covered by the first polymer film pattern, a second region covered by the second polymer film pattern, and a third region not covered by the first polymer film pattern or the second polymer film pattern, the third region enclosing both of the first and second regions therewithin, wherein the applying of the first polymer material further comprises:

making a solution of the first polymer material in droplets; and ejecting the droplets onto the substrate using a near-field electrospinning method to form the first polymer film pattern.

2. The method according to claim 1, wherein the first polymer material includes one selected from a polyolefin-based polymer (polyethylene, polypropylene, low-density polyethylene (LDPE)), an aromatic polymer (polystyrene, poly(divinyl benzene)), a chloride-based polymer (polyvinyl chloride, polyvinylidene chloride, polyvinylbenzene chloride), a fluorine-based polymer (polyvinylidenefluoride, polytetrafluoride, polytrivinylfluoride), a silicon-based polymer (polysiloxane), and polybutadiene.

3. The method according to claim 1, wherein the conductive material includes poly(3,4-ethylenedioxythiophene) (PEDOT), which has hydrophilicity.

4. The method according to claim 1, wherein, in applying the second polymer material, the second polymer material is applied on the substrate, on which the first polymer film pattern is applied, using any one printing method selected from inkjet, screen printing, gravure printing, offset printing, and pad printing.

5. The method according to claim 1, wherein the substrate is formed of any one selected from silicon, glass, plastic, paper, and metal.

6. The method according to claim 1, wherein, during the dewetting of the second polymer material, the second polymer material is split into two parts between which the first polymer film pattern is sandwiched.

7. The method according to claim 1, wherein the second polymer material is applied on the substrate, such that a top surface of the substrate defines a first region covered by the first polymer film pattern, a second region covered by the second polymer material, and a third region not covered by the first polymer film pattern or the second polymer material, the third region enclosing both of the first and second regions therewithin.

8. The method according to claim 1, wherein all of the first polymer material applied on the substrate remains on the substrate to form the first polymer film pattern without being partially removed from the substrate.

9. The method according to claim 1, wherein:

the second polymer film, taken from the plan view, consists of a first part disposed on and in contact with one side of the first polymer film pattern and a second part disposed on and in contact with the other side of the first polymer film; and the first polymer film pattern and the first and second parts of the second polymer film collectively form a single pattern unit.

10. The method according to claim 1, wherein, in applying the second polymer material, the second polymer material is disposed to extend along an entire width of first polymer film pattern from one side to the other side of the first polymer film pattern.

11. A method of forming a pattern of a polymer film comprising:

applying a first polymer material, which has hydrophobicity, on a substrate to form a first polymer film pattern, the first polymer film pattern having a linear shape with a width within a range of tens of nanometers to hundreds of micrometers;

applying a second polymer material, which has hydrophilicity, on the substrate on which the first polymer film pattern is formed, to cover at least a portion of the first polymer film pattern, wherein the second polymer material has a predetermined difference in surface energy from the first polymer material;

dewetting the second polymer material covering the first polymer film pattern to move toward a substrate region at which the first polymer film pattern is not formed;

annealing the substrate in a state in which the second polymer material has moved to the extent that the second polymer material does not cover the first polymer film pattern; and evaporating an organic solvent included in the second polymer material through annealing to form a second polymer film pattern on the substrate, wherein:

the first polymer film pattern, taken from a plan view, does not have any opening; and the first and second polymer film patterns are disposed on the substrate, such that a top surface of the substrate defines a first region covered by the first polymer film pattern, a second region covered by the second polymer film pattern, and a third region not covered by the first polymer film pattern or the second polymer film pattern, the third region enclosing both of the first and second regions therewithin, wherein the applying of the first polymer material further comprises:

making a solution of the first polymer material in droplets; and ejecting the droplets onto the substrate using a near-field electrospinning method to form the first polymer film pattern.

12. The method according to claim 11, wherein the second polymer material includes an insulating material of polyvinyl alcohol and polyvinylphenol.

* * * * *